United States Patent [19]
Bielby et al.

[11] Patent Number: 6,163,166
[45] Date of Patent: Dec. 19, 2000

[54] PROGRAMMABLE LOGIC DEVICE WITH SELECTABLE SCHMITT-TRIGGERED AND THRESHOLD-TRIGGERED BUFFERS

[75] Inventors: Robert Bielby, Pleasanton; Krishna Rangasayee, Mountain View; Brad Ishihara, Sunnyvale, all of Calif.

[73] Assignee: Altera Corporation, San Jose, Calif.

[21] Appl. No.: 09/321,257

[22] Filed: May 26, 1999

Related U.S. Application Data

[60] Provisional application No. 60/086,873, May 27, 1998.

[51] Int. Cl.[7] ....................................................... G06F 7/38

[52] U.S. Cl. .................................. 326/38; 326/39; 326/40

[58] Field of Search .................................. 326/22, 31, 35, 326/38, 39–41; 327/50, 205

[56] References Cited

U.S. PATENT DOCUMENTS

| | | | |
|---|---|---|---|
| 4,903,223 | 2/1990 | Norman et al. | 364/716 |
| 5,748,616 | 5/1998 | Riley | 370/242 |
| 5,952,846 | 9/1999 | Silver | 326/41 |
| 5,959,466 | 9/1999 | McGowan | 326/39 |

Primary Examiner—Son Mai
Attorney, Agent, or Firm—William S. Galliani; Pennie & Edmonds LLP

[57] ABSTRACT

A programmable logic device has buffers that may be selectively programmed for Schmitt-triggered and threshold-triggered operation. The programmable Schmitt-triggered buffers are connected to circuit nodes that are sensitive to noisy environments. The programmable threshold-triggered buffers are connected to circuit nodes that have critical timing requirements.

11 Claims, 4 Drawing Sheets

PROGRAMMABLE LOGIC DEVICE WITH SELECTABLE SCHMITT-TRIGGERED AND THRESHOLD-TRIGGERED BUFFERS

This application claims priority to the provisional patent application entitled: "Programmable Logic Device With Selectable Schmitt-Triggered and Threshold-Triggered Buffers", Ser. No. 60/086,873, filed May 27, 1998.

BRIEF DESCRIPTION OF THE INVENTION

This invention relates generally to programmable logic devices. More particularly, this invention relates to a programmable logic device with buffers that may be selectively programmed for Schmitt-triggered and threshold-triggered operation.

BACKGROUND OF THE INVENTION

Digital systems commonly operate in noisy conditions. Noisy conditions are usually defined as environments where there are signals unrelated to the signal of interest. In some cases, the noise content can be so large that false switching occurs. That is, noise can cause a metastable environment in which a digital low signal appears as a digital high signal, or vice versa.

A common approach to eliminating or reducing the effects of noise in a digital system is to employ logic that relies upon a hysterisis detection scheme, instead of a fixed threshold detection scheme. Hysterisis is a condition in which a variable quantity decreases at a rate different from that at which it increases, thereby producing a plot with a double-line curve. In a digital context, the hysterisis detection method is commonly referred to as a Schmitt-triggered input. A Schmitt-trigger is a circuit that produces uniform-amplitude output pulses from a random-amplitude input signal. For example, a Schmitt-trigger is commonly used to convert a sine wave to a square wave. Also, Schmitt-trigger circuits are particularly useful for providing a smooth reliable output from a circuit that may have some noise on the input. This ability to smooth-out noise is increasingly important for low voltage electronic devices.

Schmitt-triggers have a delay characteristic that may be disadvantageous. For example, a Schmitt-triggered circuit can cause a timing delay of 200 pico-seconds or more between the input and the output of the circuit. In a situation where precise timing between the input and output of the circuit is critical, it is a disadvantage to use a Schmitt-trigger, and a threshold-triggered operation would be more advantageous.

It would be highly desirable to improve the noise immunity of selected buffers in a programmable logic device by utilizing Schmitt-trigger technology, while simultaneously exploiting threshold-triggered buffers at circuit nodes in programmable logic devices that have certain critical timing requirements.

SUMMARY OF THE INVENTION

A programmable logic device has buffers that may be selectively programmed for Schmitt-triggered and threshold-triggered operation. The programmable Schmitt-triggered buffers are connected to circuit nodes that are sensitive to noisy environments. The programmable threshold-triggered buffers are connected to circuit nodes that have critical timing requirements.

BRIEF DESCRIPTION OF THE DRAWINGS

For a better understanding of the invention, reference should be made to the following detailed description taken in conjunction with the accompanying drawings, in which.

Like reference numerals refer to corresponding parts throughout the drawings.

DETAILED DESCRIPTION OF THE INVENTION

Figure 1:
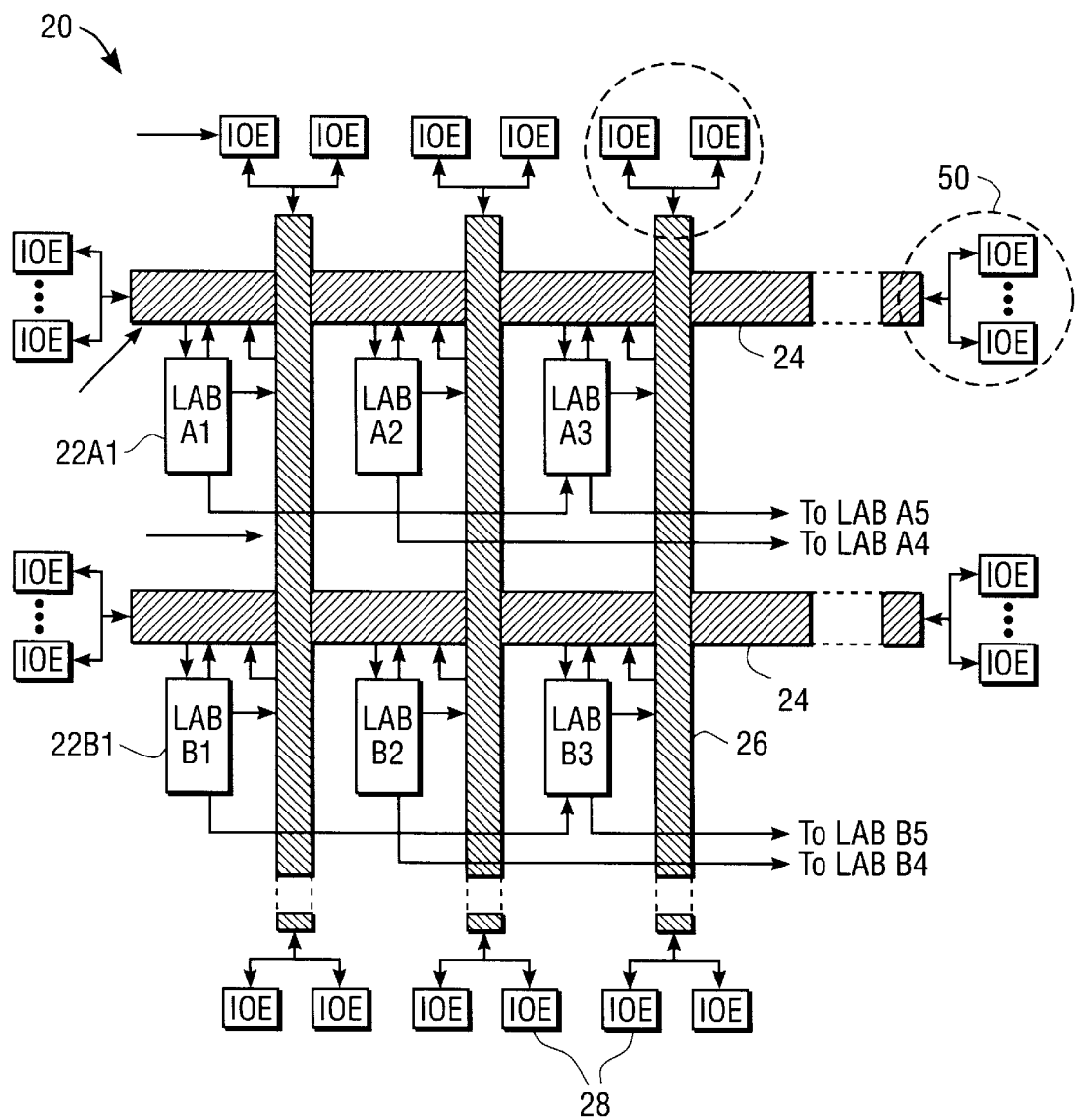
FIG. 1 illustrates a programmable logic device incorporating programmable input/output buffers in accordance with the invention.

FIG. 1 illustrates a programmable logic device 20 incorporating programmable input/output buffers in accordance with the invention. The programmable logic device 20 includes a set of logic array blocks 22. Row interconnect circuitry 24 and column interconnect circuitry 26 link the various logic array blocks 22. Input/output elements 28 positioned at the ends of the row interconnect circuitry 24 and column interconnect circuitry 26 are used for input/output connections with external devices.

The present invention is directed toward improved input/output elements 28 that may be used at the periphery of a programmable logic device 20, as shown in FIG. 1, or at other locations within a programmable logic device 20. In accordance with the invention, the input/output elements 28 are user selectable for either Schmitt triggered operation or threshold-triggered operation.

Figure 2:
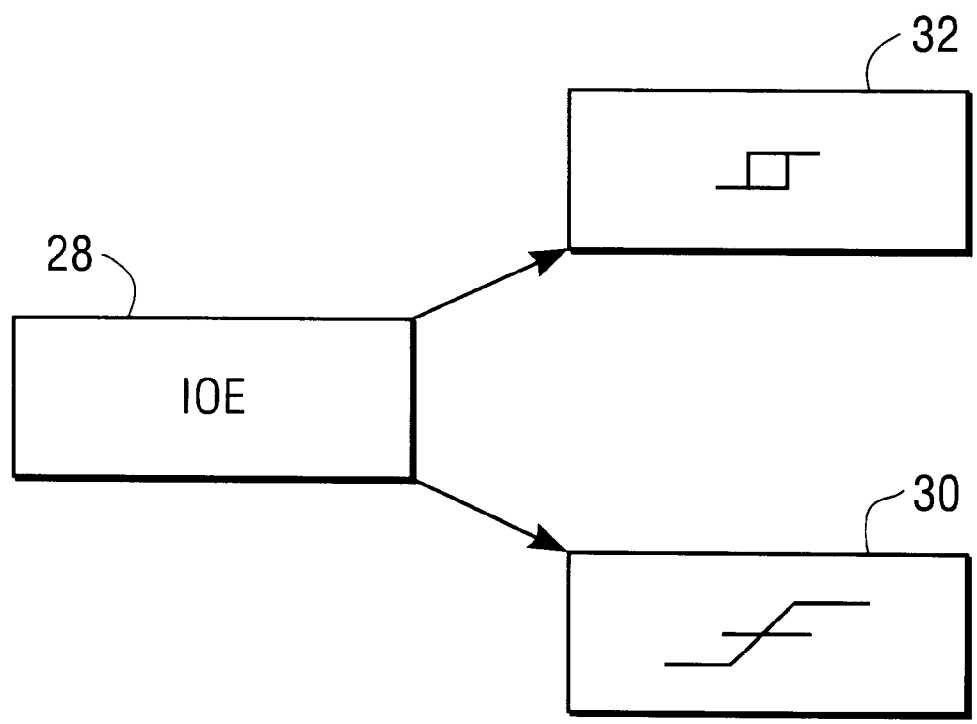
FIG. 2 illustrates an alternately programmable Schmitt-trigger and threshold-trigger embodiment of the input/output element of the invention.

FIG. 2 illustrates that the input/output element 28 of the invention may be implemented as either a traditional threshold-triggered buffer 30 or as Schmitt-triggered buffer 32. Any number of known techniques may be used to implement the threshold-triggered buffer 30 and the Schmitt-triggered buffer 32 in programmable logic. That is, the programmable logic is configured in any number of ways to implement the known logical functions of a threshold-triggered buffer and a Schmitt-triggered buffer.

Those skilled in the art will appreciate that the invention provides a novel programmable logic feature that allows the optimized programming of individual input/output elements 28. Schmitt-triggered buffers are preferably used to reduce the sensitivity to noisy environments while a threshold-triggered buffer is used when a circuit's timing is critical. When the Schmitt-triggered buffer is selected, there is reduced switching performance as compared to a traditional fixed-threshold buffer. When the increased delay associated with the Schmitt-triggered input cannot be tolerated, a threshold-triggered buffer is used.

Figure 3:
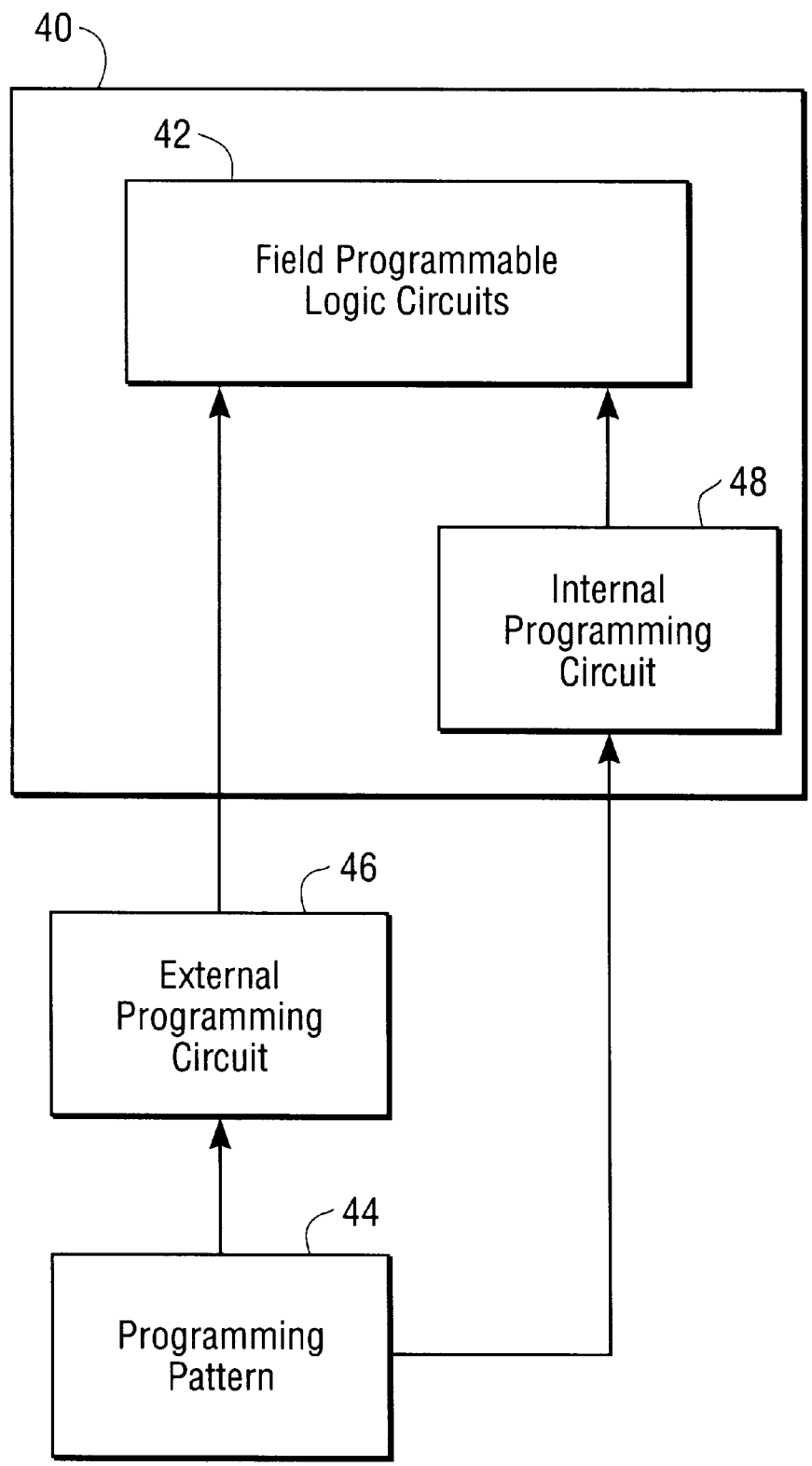
FIG. 3 illustrates programming operations used to construct a device in accordance with the invention.

In accordance with the invention, the type of input/output element 28 to be used at different parts of the programmable logic device may be established during the programming process. FIG. 3 illustrates two techniques for programming a field programmable logic device with programmed Schmitt-triggered buffers and programmed threshold-triggered buffers.

FIG. 3 illustrates a field programmable logic device 40 that includes a set of field programmable logic circuits 42, including programmable input/output elements of the type previously described. A programming pattern 44 specifies a logical function and input/output buffer configurations. The programming pattern 44 is programmed into the field programmable logic circuits 42 through an external programming circuit 46. The external programming circuit 46 may be automatic test equipment or some other external device which generates an appropriate set of programming voltages with designated pulse widths and voltage values. An industry-standard 4-pin Joint Test Action Group (JTAG) interface (IEEE Std. 1149.1—1990) may be used to install the programming pattern 44.

Alternately, in-system programming may be used. In-system programmability allows field programmable logic circuits 42 to be programmed without an external programming circuit 46. In-system programmability is used when the device is positioned on a circuit board and therefore cannot be programmed with an external programming circuit. As shown in FIG. 3, the programming pattern 44 is applied to an internal programming circuit 48. The internal programming circuit 48 internally generates voltage signals that are used to program the field programmable logic circuits 42 in accordance with the programming pattern 44. The Schmitt-triggered or threshold-triggered input/output elements 28 may also be selected through other techniques, such as switches, jumpers, fuses, and the like.

Figure 4:
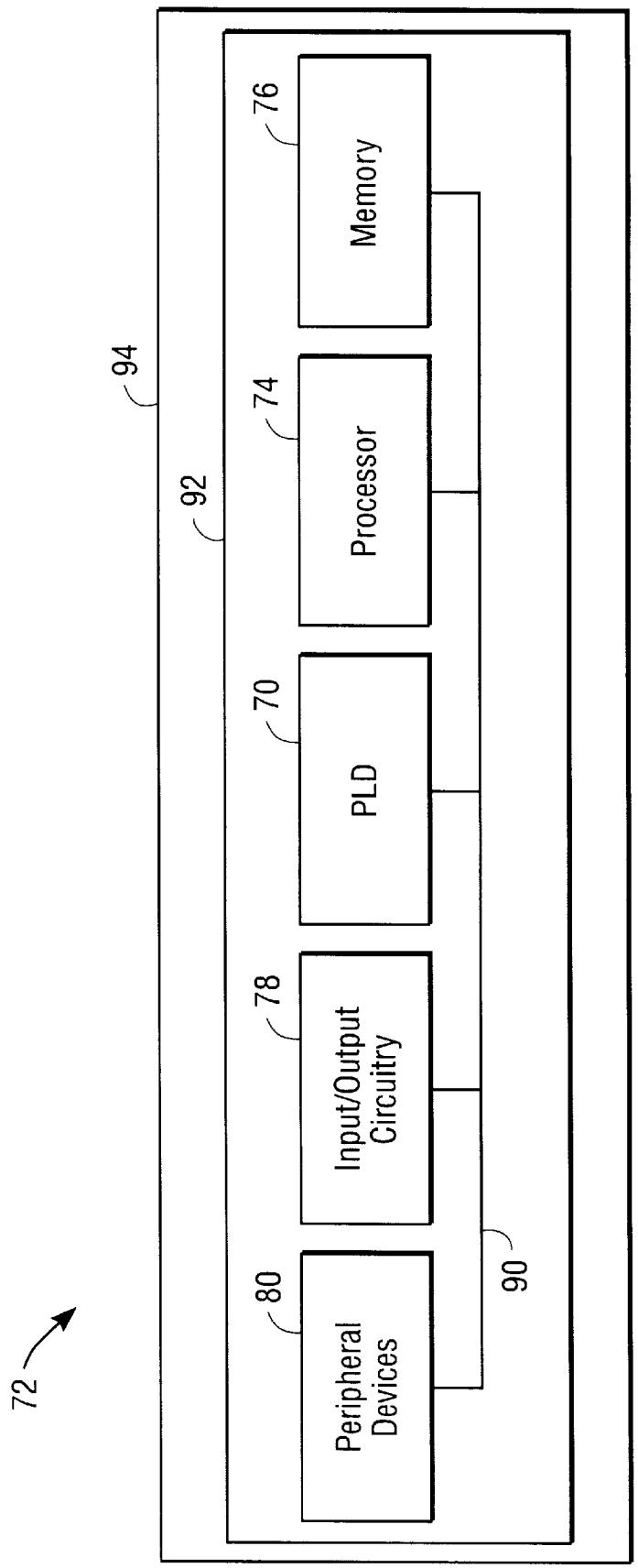
FIG. 4 illustrates the programmable logic device of the invention incorporated into a larger digital system.

FIG. 4 illustrates a programmable logic device (PLD) 70 of the invention forming a part of a data processing system 72. The data processing system 72 may include one or more of the following components: a processor 74, a memory 76, input/output circuitry 78, and peripheral devices 80. These components are coupled together by a system bus 90 and are populated on a circuit board 92, which is contained in an end-user system 94.

The system 72 can be used in a wide variety of applications, such as computer networking, data networking, instrumentation, video processing, digital signal processing, or any other application where the advantage of using re-programmable logic is desirable. The PLD 70 can be used to perform a variety of logic functions. For example, the PLD 70 can be configured as a processor or controller that works in cooperation with processor 74. The PLD 70 may also be used as an arbiter for arbitrating access to a shared resource in the system 72. In yet another example, the PLD 70 can be configured as an interface between the processor 74 and one of the other components in the system 72.

The foregoing description, for purposes of explanation, used specific nomenclature to provide a thorough understanding of the invention. However, it will be apparent to one skilled in the art that the specific details are not required in order to practice the invention. In other instances, well known circuits and devices are shown in block diagram form in order to avoid unnecessary distraction from the underlying invention. Thus, the foregoing descriptions of specific embodiments of the present invention are presented for purposes of illustration and description. They are not intended to be exhaustive or to limit the invention to the precise forms disclosed. Obviously, many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. It is intended that the scope of the invention be defined by the following Claims and their equivalents.

What is claimed is:

1. A programmable logic device, comprising:
   programmable Schmitt-triggered buffers connected to circuit nodes that are sensitive to noisy environments,
   programmable threshold-triggered buffers connected to circuit nodes that have critical timing requirements; and
   an internal programming circuit to selectively establish said programmable Schmitt-triggered buffers and said programmable threshold-triggered buffers in response to a programming pattern.

2. A method of programming a logic device, said method comprising the steps of:
   establishing Schmitt-triggered buffers at circuit nodes that are sensitive to noisy environments; and
   implementing threshold-triggered buffers at circuit nodes with critical timing requirements;
   wherein said establishing step and said implementing step each include the step of selectively producing said Schmitt-triggered buffers and said threshold-triggered buffers in response to a programming pattern.

3. The method of claim 2 wherein said producing step includes the step of producing said Schmitt-triggered buffers and said threshold-triggered buffers with an internal programming circuit responsive to said programming pattern.

4. The method of claim 2 wherein said producing step includes the step of producing said Schmitt-triggered buffers and said threshold-triggered buffers with an external programming circuit responsive to said programming pattern.

5. A digital system comprising:
   input/output circuitry including
   a set of programmable input/output nodes, each programmable input/output node of said set of programmable input/output nodes being alternately configurable as a Schmitt-triggered buffer and a threshold-triggered buffer; and
   a logic device connected to said input/output circuitry.

6. The digital system of claim 5 wherein said logic device includes a plurality of logic array blocks.

7. The digital system of claim 5 further comprising a system bus connected to said input/output circuitry.

8. The digital system of claim 7 further comprising a plurality of system elements connected to said system bus.

9. The digital system of claim 8 wherein said plurality of system elements include system elements selected from the group consisting of; a peripheral device, an input/output device, a microprocessor, and an external memory device.

10. The digital system of claim 5 wherein said input/output circuitry includes a first set of programmable input/output nodes programmed as Schmitt-triggered buffers in a noisy environment and a second set of programmable input/output nodes programmed as threshold-triggered buffers in an environment with critical timing requirements.

11. The digital system of claim 5 further comprising an internal programming circuit to configure said set of programmable input/output nodes.

* * * * *